United States Patent
Yang et al.

(10) Patent No.: US 7,192,667 B2
(45) Date of Patent: Mar. 20, 2007

(54) DEVICE AND METHOD FOR CONTROLLING FUEL CELL SYSTEM

(75) Inventors: Jefferson Y S Yang, Orange, CA (US); Te-Chou Yang, Kaohsiung (TW); Yao-Sheng Hsu, Taipei (TW)

(73) Assignee: Asia Pacific Fuel Cell Technologies, Ltd., Taipei (TW)

( * ) Notice: Subject to any disclaimer, the term of this patent is extended or adjusted under 35 U.S.C. 154(b) by 548 days.

(21) Appl. No.: 10/609,396

(22) Filed: Jul. 1, 2003

(65) Prior Publication Data

US 2004/0023083 A1 Feb. 5, 2004

(30) Foreign Application Priority Data

Jul. 12, 2002 (TW) .............................. 91115561 A

(51) Int. Cl.
*H01M 8/04* (2006.01)
(52) U.S. Cl. ..................... 429/25; 429/13; 429/23; 700/286
(58) Field of Classification Search ............... 429/13, 429/23, 25
See application file for complete search history.

(56) References Cited

U.S. PATENT DOCUMENTS

| | | | |
|---|---|---|---|
| 4,988,283 A * | 1/1991 | Nagasawa et al. | 429/17 |
| 6,500,572 B2 * | 12/2002 | Knights et al. | 429/13 |
| 6,638,653 B2 * | 10/2003 | Andou et al. | 429/20 |
| 2002/0146606 A1 * | 10/2002 | Kobayashi et al. | 429/24 |
| 2003/0091876 A1 * | 5/2003 | Rusta-Sellehy et al. | 429/17 |

* cited by examiner

Primary Examiner—Dah Wei Yuan
Assistant Examiner—Karie O'Neill
(74) Attorney, Agent, or Firm—Rosenberg, Klein & Lee

(57) ABSTRACT

A control device for controlling the operation of a fuel cell system is disclosed, including a microprocessor, a voltage detection circuit, a current detection circuit, a hydrogen pressure detection circuit, a temperature detection circuit, an air flow rate control circuit that is controlled in a pulse width modulation manner, and a pulse signal generation circuit. The air flow rate control circuit is controlled by the microprocessor for regulating the air flow rate through an air supply conduit in a pulse width modulation manner in accordance with output current of a fuel cell stack. The pulse signal generation circuit is controlled by the microprocessor to generate pulse signals for controlling hydrogen flow through a hydrogen supply conduit. The control device monitors the operation conditions of the fuel cell system and performs a preset control process to control the operation of the fuel cell stack so as to optimize the efficiency and overall performance of the fuel cell system.

9 Claims, 2 Drawing Sheets

DEVICE AND METHOD FOR CONTROLLING FUEL CELL SYSTEM

BACKGROUND OF THE INVENTION

1. Field of the Invention

The present invention relates generally to the field of fuel cells, and in particular to a device for controlling a fuel cell system and a method for performing the control operation for the fuel cell system.

2. Description of the Prior Art

Fuel cells are an electro-chemical device that make use of electro-chemical reaction between a fuel, such as hydrogen, and an oxidizer, such as oxygen contained in the surrounding air, to generate electrical power. The fuel cells are advantageous in low contamination, high efficiency and high power density. Thus, developments and researches are intensively devoted to the fuel cell field for exploitation of the utilization thereof. A variety of fuel cells are available, among which proton exchange membrane fuel cell, abbreviated as PEMFC, is the most prospective one due to the advantages of low operation temperature, fast activation and high power density with respect to unit weight and volume.

A typical fuel cell stack is comprised of a number of membrane electrode assemblies (MEA). Each MEA comprises an anode catalyst layer, a polymeric proton exchange membrane and a cathode catalyst layer. A basic cell can be formed by coupling the MEA with two gas diffusers and a bipolar plate in an overlapping and stacked manner.

The operation of the fuel cells is dependent upon the proton exchange membrane that functions to convey protons between the cathode and the anode of the fuel cell for the progress of the electro-chemical reaction. The performance of the fuel cells is heavily dependent upon the reaction conditions, such as operation temperature, hydrogen flow rate and air flow rate. On the other hand, the operation safety of the fuel cells is dependent upon output voltage and current of the fuel cells. Besides the above factors that affect the overall performance/effectiveness of the fuel cells, in order to realize the optimum performance and safe operation of the fuel cells, additional effective control measures are required.

SUMMARY OF THE INVENTION

Thus, a primary object of the present invention is to provide a control device for operating fuel cell systems in optimum conditions.

Another object of the present invention is to provide a control method for controlling the operation of the fuel cell to realize the optimum performance of the fuel cell system.

A further object of the present invention is to provide a control device for controlling and providing safe operation of the fuel cell system by detecting operation conditions of the fuel cells and, in response thereto, initializing a control process in accordance with the detection result.

To achieve the above objects, in accordance with the present invention, there is provided a control device for controlling the operation of a fuel cell system. The control device comprises a microprocessor, a voltage detection circuit, a current detection circuit, a hydrogen pressure detection circuit, a temperature detection circuit, an air flow rate control circuit that is controlled in a pulse width modulation manner, and a pulse signal generation circuit. The air flow rate control circuit is controlled by the microprocessor for regulating the air flow rate through an air supply conduit in a pulse width modulation manner in accordance with output current of a fuel cell stack. The pulse signal generation circuit is controlled by the microprocessor to generate pulse signals for controlling hydrogen flow through a hydrogen supply conduit. The control device monitors the operation conditions of the fuel cell system and performs a preset control process to control the operation of the fuel cell stack so as to optimize the efficiency and overall performance of the fuel cell system.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF PREFERRED EMBODIMENT

Figure 1:
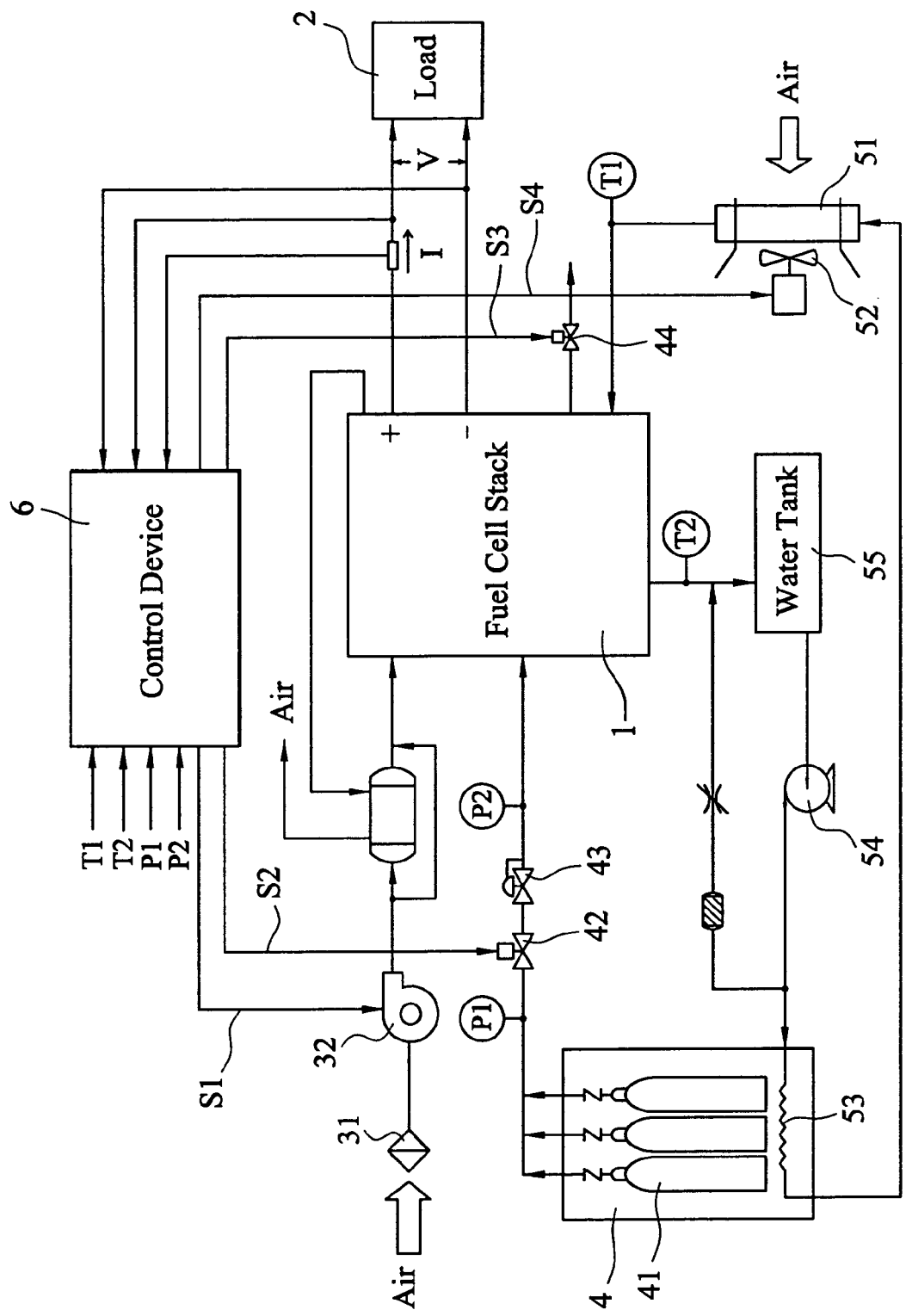
FIG. 1 is a system block diagram of a fuel cell system in accordance with the present invention.

With reference to the drawings and in particular to FIG. 1, a fuel cell system in accordance with the present invention comprises a fuel cell stack 1 that is comprised of a number of membrane electrode assemblies (MEAs), each comprising an anode electrode layer, a proton exchange membrane and a cathode electrode layer, which together forms a basic cell unit of electro-chemical reaction. The MEAs are combined with a hydrogen diffuser, an air diffuser and a bipolar plate in a cascade manner to form the fuel cell. A conductor plate and an end plate are then secured to opposite ends of a number of MEAs to form the fuel cell stack. The MEAs of a fuel cell stack are electrically connected in either serial manner or parallel manner to provide an output of predetermined voltage and current. The fuel cell stack has a positive terminal (marked "+" in the drawing) and a negative terminal (marked "−" in the drawing) for supply of a direct current as output to a load 2.

For the electro-chemical reaction carried out inside the fuel cells stack 1, air is drawn into the fuel cell stack 1 by a air pumping device 32, such as a blower, through an air filter 31, both being connected to the fuel cell stack 1 by an air supply conduit. Hydrogen, on the other hand, is supplied by a fuel supply device 4 to the fuel cell stack 1. The fuel supply device 4 is comprised of a number of alloy-based hydrogen storage canisters 41, each containing hydrogen therein for serving as fuel for the fuel cell stack 1. The hydrogen supplied from the fuel supply device 4 is conducted along a hydrogen supply conduit (not labeled) through a hydrogen valve 42 and a pressure regulator 43 to the fuel cell stack 1. The hydrogen valve 42 and the pressure regulator 43 function to control the flow rate and pressure of the hydrogen supplied to the fuel cells stack 1. A hydrogen exhaust valve 44 is mounted to the fuel cell stack 1 for relief of additional and residual hydrogen, as well as other undesired gases and liquids, from the fuel cell stack 1.

A temperature regulation device comprises a heat radiator 51, a fan 52, a heat exchanger 53, a pump 54 and a water tank 55 for controlling and maintaining a constant temperature for the operation of the fuel cell stack 1. The water tank 55 reserves an amount of water serving as cooling agent. The pump 54 conveys the water from the water tank 55 through the heat exchanger 53 that is contained in the fuel supply device 4 toward, the heat radiator 51. The fan 52 causes air flows through the radiator 51 for dissipation of heat from the water flowing through the radiator 51 into the surrounding air and thus cooling the water. The cooled water is conducted through the fuel cell stack 1 by a water supply conduit whereby temperature inside the fuel cell stack 1 can be controlled and maintained at a desired level or operation temperature. The water tank 5 also functions to collect water generated by the electro-chemical reaction induced in the fuel cells stack 1 as byproducts.

Figure 2:
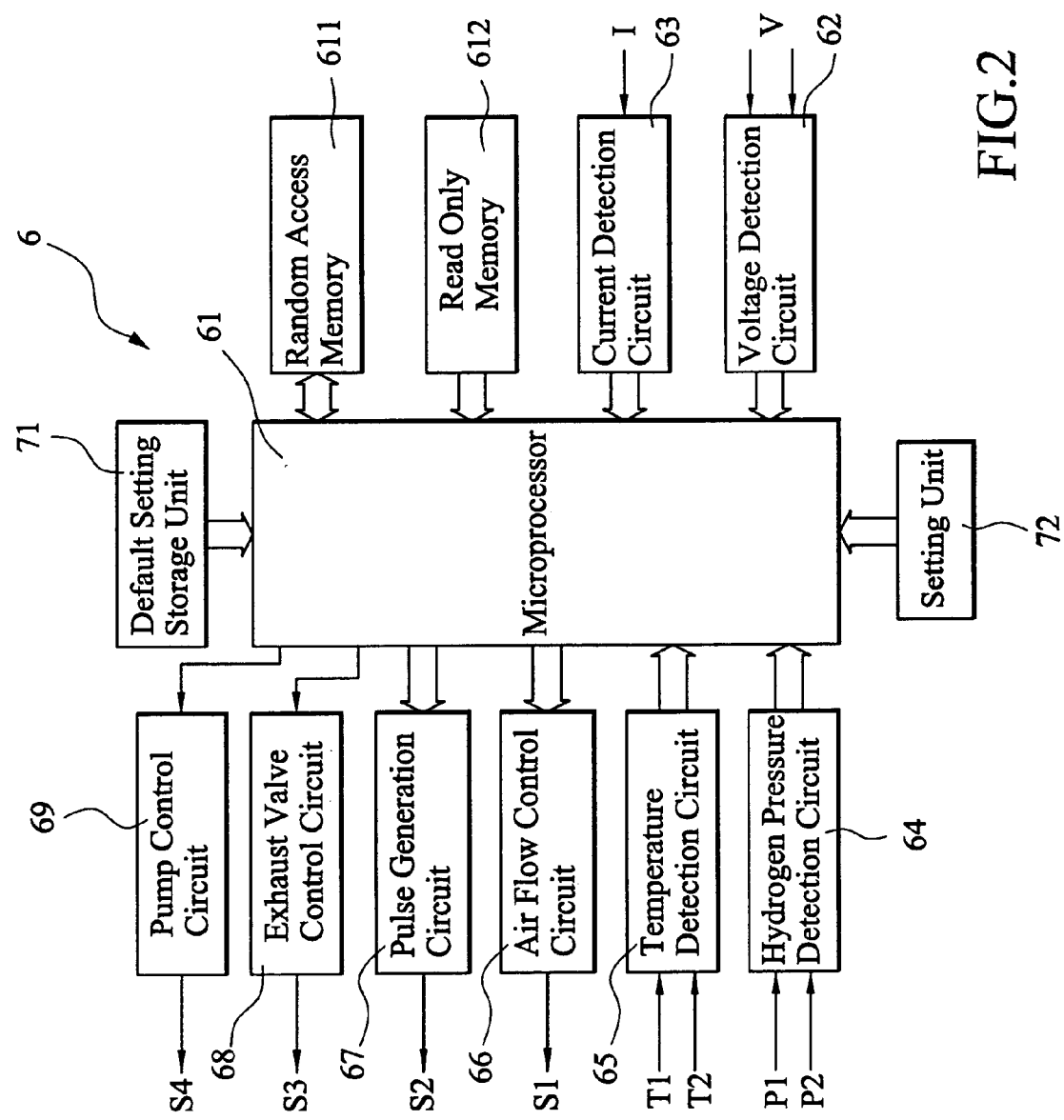
FIG. 2 is a block diagram of a control device of the fuel cell system of the present invention.

In accordance with the present invention, a control device 6 is incorporated in the fuel cell system for controlling the operation of the fuel cell system. Also referring to FIG. 2, the control device 6 comprises a microprocessor 61 to which a random access memory (RAM) 611 and a read only memory (ROM) 612 are incorporated. The control device 6 comprises a voltage detection circuit 62 and a current detection circuit 63 connected to the positive and negative terminals of the fuel cell stack 1.

The voltage detection circuit 62 detects an output voltage of the fuel cell stack 1 across the positive ("+") and negative ("−") terminals of the fuel cells stack 1. The output voltage of the fuel cell stack 1 is analog and is indicated by reference numeral "V" in the drawings. The voltage detection circuit 62 comprises an analog-to-digital converter that converts the analog output voltage V into a digital signal that is then applied to the microprocessor 61.

The current detection circuit 63 detects an output direct current of the fuel cell stack 1 across the positive ("+") and negative ("−") terminals. The output current of the fuel cell stack 1, which is indicated by reference numeral "I" in the drawings, is processed by an analog-to-digital converter, which converts the analog output current I into a digital signal that is then applied to the microprocessor 61.

A hydrogen pressure detection circuit 64 comprises a high pressure side (upstream side) pressure gauge P1 and a low pressure side (downstream side) pressure gauge P2 mounted to the hydrogen supply conduit connecting the fuel supply device 4 and the fuel cell stack 1, respective upstream and downstream of the hydrogen valve 42 and the pressure regulator 43. The pressure gauges P1 and P2 detect the hydrogen pressure inside the hydrogen supply conduit on the upstream and downstream sides and provide signals corresponding to the upstream hydrogen pressure (pressure of the hydrogen discharged from the fuel supply device 4) and the downstream hydrogen pressure (pressure of the hydrogen supplied to the fuel cell stack 1 that is regulated by the pressure regulator 43) to an analog-to-digital converter incorporated in the hydrogen pressure detection circuit 64, which generates and applies digital signals representing the upstream and downstream hydrogen pressures to the microprocessor 61.

A temperature detection circuit 65 comprises a first temperature gauge T1 and a second temperature gauge T2 mounted to the water supply conduit that conducts the cooling water through the fuel cell stack 1, respective upstream and downstream of the fuel cell stack 1. The temperature gauges T1 and T2 detect the temperature of the cooling water flowing through the water supply conduit upstream and downstream of the fuel cell stack 1 and provide signals corresponding to the upstream water temperature and the downstream water temperature, which broadly speaking are related to the temperature inside the fuel cell stack 1, to an analog-to-digital converter incorporated in the temperature detection circuit 65, which generates and applies digital signals representing the upstream and downstream water temperatures to the microprocessor 61.

An air flow control circuit 66 comprises a pulse width modulation (PWM) circuit controlled by the microprocessor 61 to generate a PWM control signal S1 for controlling the air flow rate caused by the air pumping device 32 to supply to the fuel cell stack 1.

A pulse generation circuit 67 is controlled by the microprocessor 61 to generate pulse signal S2 that controls opening/closing operation of the hydrogen valve 42. By means of the control of the hydrogen valve 42 by the pulse signal S2 generated by the pulse generation circuit 67, the flow of hydrogen from the fuel supply device 4 to the fuel cell stack 1 can be well controlled. For example, the hydrogen valve 42 can be operated in a normally open manner and is shut down by the pulse signal S2 every 30 seconds until the hydrogen pressure inside the hydrogen supply conduit drops below a predetermined level. Thereafter, the hydrogen valve 42 is opened again to resume supply of hydrogen to the fuel cell stack 1.

The control device 6 further comprises an exhaust valve control circuit 68 and a pump control circuit 69 coupled to the microprocessor 61. Under the control of the microprocessor 61, the exhaust valve control circuit 68 generates an exhaust valve control signal S3, which controls opening/closing of the exhaust valve 44. The pump control circuit 69, under the control of the microprocessor 61, generates a pump control signal S4 for controlling the operation of the pump 54.

In addition, the control device 6 comprises a default setting storage unit 71 coupled to the microprocessor 61 for storage of default setting values or reference values of operation parameters, such as rated voltage, rated current, maximum current, hydrogen pressure, and operation temperature. A setting unit 72 is coupled to the microprocessor 61 for establishing a control process and setting the operation parameters by for example an operator. Thus, the operator may enter desired settings for the operation parameters, as well as establishing any desired control process based on requirements for each particular case. The fuel cell stack 1 may then be operated in accordance with the established control process, based on the operation parameters set in the storage unit 71 under the control of the control device 6.

Based on the hardware architecture described above, the present invention also offers a method for controlling the operation of the fuel cell stack 1, comprising the following steps. At first, the control method starts with a start-up routing for activation of the fuel cell system by opening the hydrogen valve 42 whereby hydrogen is supplied from the fuel supply device 4 to the fuel cell stack 1. The air pumping device 32 is then turned on to draw in the surrounding air, which contains oxygen, and supply the air to the fuel cell stack 1 at a maximum air flow rate for a predetermined period of time. The supply of the air at the maximum air flow rate helps removing any water residual inside the fuel cell stack 1, such as water that remains in separator plates of the fuel cell stack during the previous operation. Thereafter, the air flow rate is reduced to a minimum level and at the same time, the hydrogen exhaust valve 44 is opened for a given period of time, such as 3 seconds, to expel impure gases out of the fuel cell stack 1 and the associated piping thereof.

Next, a temperature regulation routing is initiated by turning on the fan 52 and the pump 54 to control and maintain the fuel cell stack 1 at a desired operation temperature.

An operation control routing is then started wherein the control device 6 detects the hydrogen pressures P1, P2 at both the high and low pressure sides of the hydrogen supply conduit. In case the low pressure side hydrogen pressure P2 is below a predetermined level, such as 4 Psi, the hydrogen valve 42 is opened for a period of time, such as 5 seconds. The hydrogen pressures P1, P2 are constantly monitored and each time the low pressure side hydrogen pressure P2 drops below the predetermined level, the hydrogen valve 42 is opened for the given period of time. The time period when the hydrogen valve 42 is opened and the predetermined level of the low pressure side hydrogen pressure P2 are stored in the storage unit 71 and can be changed by means of the setting unit 72.

The control device 6 detects the output current I of the fuel cell stack 1. Based on the output current I, the air flow rate caused by the air pumping device 32 is changed. In an embodiment of the present invention, the air pumping device 32 is driven by an electrical motor that is controlled by the control device 6 in a pulse width modulation manner. The air pumping device 32 is controlled to provide a minimum flow rate of 50 slm. An example of the control of the air flow rate of the air pumping device 32 is as follows:

(1) When the output current I is smaller than a preset lower limit, Imin, such as 20 Amps, the air flow rate of the air pumping device 32 is set at the minimum value.

(2) When the output current I is greater than the lower limit Imin, but smaller than a preset upper limit, Imax, the flow rate is set to be three times of the required flow rate in accordance with the output current I in order to supply sufficient oxygen to the fuel cell stack 1.

(3) When the output current I is greater than the upper limit Imax, the flow rate of the air pumping device 32 is set to the maximum flow rate that can be taken by the air pumping device 32.

The output voltage of the fuel cell stack 1 may get lowered when liquid accumulation occurs inside the fuel cell stack 1. In this case, the air pumping device 32 supplies air at the maximum air flow rate to remove the accumulated liquid. For example, if the rated output voltage of the fuel cell stack 1 is 48 volts and if a lower bound of the output voltage is set to be 36–42 volts, when the detected value of the output voltage, such as 42 volts, is lower than the rated value, the air pumping device 32 is controlled to supply air at the maximum air flow rate for a given period of time, such as 3 seconds, and then resumes the normal flow rate. At the same time, the hydrogen exhaust valve 44 is opened for a given period of time, such as 0.5 seconds, in order to expel the liquid accumulated in the fuel cell stack 1. In case the output voltage of the fuel cell stack 1 gets down into the threshold of the lower bound, such as 36 volts, for the sake of safety of operation, the fuel cell system is completely shut down.

Theoretical normal operation temperature of the fuel cell stack 1 is between 45–60° C. When the operation temperature of the fuel cell stack 1 is within the normal operation temperature range, the operation of the fuel cell is kept. When the temperature gets higher than the normal operation temperature, the fan 52 is actuated and air flow is caused through the radiator 51 to lower down the temperature of the cooling water that flows through the fuel cell stack 1 in order to have the temperature of the fuel cell stack 1 get lower than for example 45° C. When the temperature continuously rises and gets higher than an upper bound of temperature set for safe operation, such as 85° C., the fuel cell system is completely shut down for safety purposes.

To this point, it is apparent to those skilled in the art that the control device 6 of the present invention, when incorporated with a fuel cell system, effectively maintains the optimum operation of the fuel cell system by monitoring the operation conditions thereof. Efficiency and operation safety of the fuel cell system is thus enhanced.

Although the present invention has been described with reference to the preferred embodiment thereof and the best mode for controlling the operation of the fuel cells, it is apparent to those skilled in the art that a variety of modifications and changes may be made without departing from the scope of the present invention which is intended to be defined by the appended claims.

What is claimed is:

1. A method for controlling a fuel, cell system including a fuel cell stack, an air pumping device and a hydrogen supply device, both coupled to the fuel cell stack to supply the air and hydrogen thereto, respectively, and a hydrogen exhaust valve coupled to the fuel cell stack for relief of the hydrogen therefrom, the method comprising the steps of:

(1) initiating a start-up routine to start supply of the air and hydrogen to the fuel cell stack through an air supply conduit and a hydrogen supply conduit, respectively;

(2) detecting hydrogen pressure inside the hydrogen supply conduit;

(3) based on the detected hydrogen pressure, selectively opening/closing a hydrogen valve mounted to the hydrogen supply conduit for controlling hydrogen flow rate through the hydrogen supply conduit;

(4) detecting output voltage and current of the fuel cell stack; and (5) selectively driving the air pumping device mounted to the air supply conduit, in a pulse width modulated manner, for controlling air flow rate through the air supply conduit in accordance with the detected output voltage of said fuel cell stack, wherein, when the detected output voltage is lower than a preset lower voltage level indicative of a presence of an unwanted liquid accumulated in the fuel cell stack, controlling the air pumping device to increase the air flow in the air supply conduit to a maximum air flow rate to thereby remove unwanted liquid accumulated in said fuel cell stack, maintaining said maximum air flow rate during a first predetermined period of time, and controlling the air pumping device to resume to a normal flow rate upon said first predetermined period of time is over.

2. The method as claimed in claim 1, wherein the start-up routine comprises the steps of:

(a) opening the hydrogen valve to supply the hydrogen flow to the fuel cell stack;

(b) actuating the air pumping device to supply a maximum flow rate of air to the fuel cell stack for a first given period of time, thereby removing residual liquid accumulated in said fuel cell stack;

(c) reducing the air flow to a minimum air flow rate; and (d) controlling the air pumping device to supply the air at the minimum air flow rate to the fuel cell stack.

3. The method as claimed in claim 2, further comprising a step of:

opening the hydrogen exhaust valve for a second given period of times, thereby expelling impure gasses out of the fuel cell stack and the hydrogen supply conduit.

4. the method as claimed in claim 1, further comprising a step of:

controlling temperature of the fuel cell stack within a preset range.

5. The method as claimed in claim 1, wherein the selective opening/closing of the hydrogen valve is performed using a pulse signal.

6. The method as claimed in claim 1, wherein the control of air flow rate comprises the steps of:
   (a) setting the air flow rate to a minimum level when an output current of the fuel cell stack is smaller than a lower limit;
   (b) setting the air flow rate to three times of a required level in accordance with the output current when the output current is greater than the lower limit but smaller than an upper limit; and
   (c) setting the air flow rate to a maximum level when the output current is greater than the upper limit.

7. The method as claimed in claim 1, further comprising the step of:
   shutting down the fuel cell system when the output voltage of the fuel cell stack is below a preset safety threshold level of the output voltage.

8. The method as claimed in claim 1, further comprising the step of: simultaneously opening said hydrogen exhaust valve when controlling the air pumping device to increase the air flow in the air supply conduit to a maximum air flow rate in said step (5).

9. The method as claimed in claim 1, further comprising the steps of:

(a) maintaining the hydrogen exhaust valve open during a second predetermined period of time after said step (5), and (b) closing the hydrogen exhaust valve upon said second predetermined period of time is over.

* * * * *